(12) United States Patent
Fukumitsu et al.

(10) Patent No.: US 10,497,679 B2
(45) Date of Patent: Dec. 3, 2019

(54) WAFER LEVEL PACKAGE AND WAFER LEVEL CHIP SIZE PACKAGE

(71) Applicant: Murata Manufacturing Co., Ltd., Nagaokakyo-shi, Kyoto-fu (JP)

(72) Inventors: Masakazu Fukumitsu, Nagaokakyo (JP); Shuhei Yamada, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 15/831,857

(22) Filed: Dec. 5, 2017

(65) Prior Publication Data
US 2018/0096972 A1 Apr. 5, 2018

Related U.S. Application Data

(63) Continuation of application No. PCT/JP2016/067752, filed on Jun. 15, 2016.

(30) Foreign Application Priority Data

Jun. 19, 2015 (JP) .................. 2015-124147

(51) Int. Cl.
*H01L 25/065* (2006.01)
*H01L 23/02* (2006.01)
*H01L 23/00* (2006.01)

(52) U.S. Cl.
CPC .......... *H01L 25/0657* (2013.01); *H01L 23/02* (2013.01); *H01L 24/94* (2013.01)

(58) Field of Classification Search
CPC ...... H01L 25/0657; H01L 23/02; H01L 24/94

USPC ........................................................ 257/686
See application file for complete search history.

(56) References Cited

U.S. PATENT DOCUMENTS

| 5,448,014 | A | 9/1995 | Kong et al. |
| 7,618,877 | B2 | 11/2009 | Onuma |
| 8,975,736 | B2 | 3/2015 | Okuno et al. |
| 8,980,696 | B2 * | 3/2015 | Meng .................... H01L 21/561 257/734 |
| 2005/0224920 | A1 | 10/2005 | Onuma |
| 2007/0190747 | A1 * | 8/2007 | Humpston .......... B81C 1/00285 438/460 |
| 2008/0070381 | A1 | 3/2008 | Onuma |

(Continued)

FOREIGN PATENT DOCUMENTS

| JP | 2820609 B2 | 11/1998 |
| JP | 2005-285853 A | 10/2005 |

(Continued)

OTHER PUBLICATIONS

International Search Report issued in International Application No. PCT/JP2016/067752, dated Aug. 9, 2016.

(Continued)

*Primary Examiner* — Michelle Mandala
(74) *Attorney, Agent, or Firm* — Arent Fox LLP

(57) ABSTRACT

A wafer level package that includes a first wafer; a second wafer facing the first wafer; a plurality of chips between the first wafer and the second wafer and arranged in an array; a plurality of sealing frames at predetermined intervals and surrounding each of the plurality of chips to seal the chips; and a coupling portion which couples opposed corners of respective sealing frames.

12 Claims, 5 Drawing Sheets

(56) References Cited

U.S. PATENT DOCUMENTS

2014/0008779 A1* 1/2014 Okuno .................. H01L 21/50
                                                    257/684
2017/0033763 A1    2/2017 Hira et al.

FOREIGN PATENT DOCUMENTS

JP      2012-169564 A    9/2012
WO   WO 2015/159465 A1   10/2015

OTHER PUBLICATIONS

Written Opinion of the International Searching Authority issued in International Application No. PCT/JP2016/067752, dated Aug. 9, 2016.

* cited by examiner

WAFER LEVEL PACKAGE AND WAFER LEVEL CHIP SIZE PACKAGE

CROSS REFERENCE TO RELATED APPLICATIONS

The present application is a continuation of International application No. PCT/JP2016/067752, filed Jun. 15, 2016, which claims priority to Japanese Patent Application No. 2015-124147, filed Jun. 19, 2015, the entire contents of each of which are incorporated herein by reference.

FIELD OF THE INVENTION

The present invention relates to a wafer level package and a wafer level chip size package.

BACKGROUND OF THE INVENTION

In recent years, attention has been paid to a wafer level chip size packaging technique in which wirings, protective films, and terminals are formed in a state of a wafer, and then the wafer is cut into individual pieces with a dicing machine or the like to form a package. In the wafer level chip size package, the size of the chip obtained by finally cutting the wafer becomes the size of the package, so that it is possible to reduce the size and weight of the chip.

For example, Patent Document 1 discloses a technique in which a plurality of electronic devices are provided on a substrate wafer, a cover wafer including a plurality of conductive paths extending therethrough is provided, and a plurality of conductive paths are aligned with a plurality of electronic devices of the substrate wafer, thereby aligning and bonding the cover wafer and the substrate wafer.

Patent Document 1: Japanese Patent No. 2,820,609

SUMMARY OF THE INVENTION

In the conventional wafer level package technique as disclosed in Patent Document 1, the electronic devices aligned on the wafer are partitioned by solder bonding portions formed without gaps. Therefore, when the wafer level package manufactured by the technique disclosed in Patent Document 1 is cut into chip sizes, it is necessary to divide the solder bonding portions. Therefore, a stress applied to the solder bonding portions during cutting with a dicing machine is likely to cause a sealing failure, and is likely to lower a non-defective rate and reliability.

The present invention has been made in view of such circumstances, and an object of the present invention is to reduce a stress applied to sealing frames during cutting with a dicing machine.

A wafer level package according to one aspect of the present invention includes: a first wafer; a second wafer which faces the first wafer; a plurality of substantially rectangular chips provided between the first wafer and the second wafer and arranged in an array; a plurality of sealing frames provided at a predetermined interval and surrounding each of the plurality of substantially rectangular chips to seal the chips; and a coupling portion which couples opposed corners of respective sealing frames.

Such a wafer level package includes the sealing frames provided spaced apart from each other. Consequently, it is possible to reduce the stress applied to the sealing frames by cutting with the dicing machine.

Further, preferably, the sealing frames have rectangular shapes, and the coupling portion is connected to corner portions of the sealing frames. In this case, it is possible to increase the length of the coupling portion. Consequently, it is possible to further reduce the stress applied to the sealing frames by cutting with the dicing machine.

In particular, preferably, the corner portions of the sealing frames have arc shapes. In this preferred embodiment, it is possible to adjust the length of the coupling portion independently of a width of a dicing line.

Further, preferably, a width of the coupling portion is narrower than widths of the sealing frames. In this preferred embodiment, the coupling portion cut with the dicing machine is formed thin. Consequently, it is possible to further reduce the stress applied to the sealing frames by cutting with a dicing machine.

A wafer level chip size package according to one aspect of the present invention is formed by cutting the coupling portion of one of the above wafer level packages by a dicing process.

According to the present invention, it is possible to reduce a stress applied to sealing frames during cutting with the dicing machine.

DETAILED DESCRIPTION OF THE PREFERRED EMBODIMENTS OF THE INVENTION

[First Embodiment]

Figure 1:
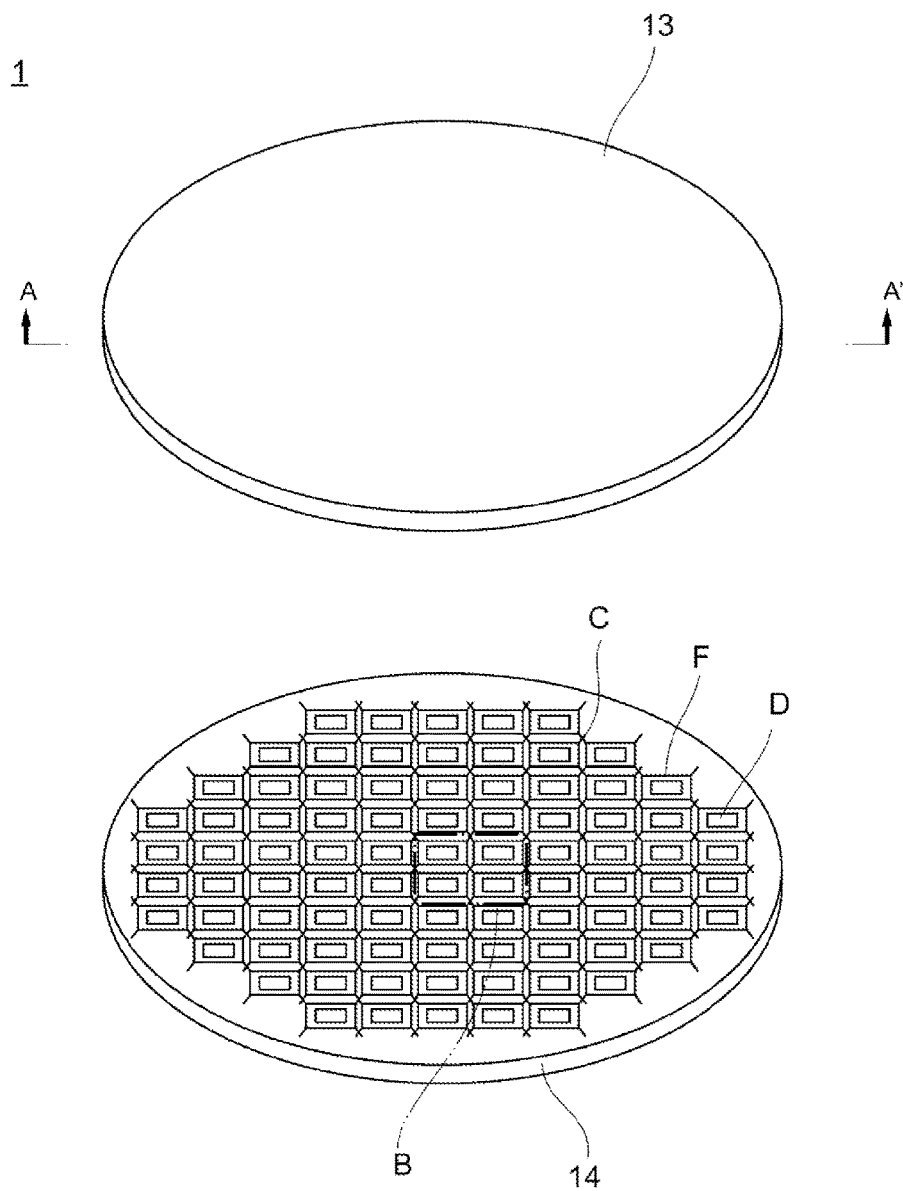
FIG. 1 is an exploded perspective view schematically illustrating a structure of a wafer level package according to a first embodiment of the present invention.

Hereinafter, a first embodiment of the present invention will be described with reference to the accompanying drawings. FIG. 1 is an exploded perspective view schematically illustrating a structure of a wafer level package 1 according to the first embodiment of the present invention.

(1. Schematic Configuration of Wafer Level Package 1)

As illustrated in FIG. 1, this wafer level package 1 includes an upper substrate (an example of a second wafer) 13 and a lower substrate (an example of a first wafer) 14. The upper substrate 13 and the lower substrate 14 have circular shapes. Further, the upper substrate 13 and the lower substrate 14 are provided so as to face each other.

A plurality of substantially rectangular devices D are formed on the lower substrate 14. The device D is, for example, a semiconductor chip such as a MEMS or an electronic circuit.

The devices D are arranged in an array on the entire surface of the lower substrate 14. More specifically, a plurality of columns in which the devices D are arranged are arranged on the lower substrate 14 in parallel to each other. Similarly, a plurality of rows in which the devices D are arranged are arranged on the lower substrate 14 so as to be parallel to each other.

In the present embodiment, the number of devices D included in each column or each row is not fixed. More specifically, the number of devices D included in rows near the center of the plurality of rows is larger than the number of devices D included in the rows on an outer side. Further, the number of devices D included in columns near the center of the plurality of columns is larger than the number of devices D included in the columns on the outer side. In this way, the devices D are arranged up to the ends of the lower substrate 14. Note that the arrangement of the devices D is not limited thereto, and the devices D may be arranged in a matrix in which the number of devices D included in all the rows and columns is fixed.

Sealing frames F are formed around a plurality of devices D. Further, coupling portions C which couple the sealing frames F to each other are formed on the lower substrate 14.

(2. Structure of Sealing Frames F and Coupling Portions C)

Figure 2:
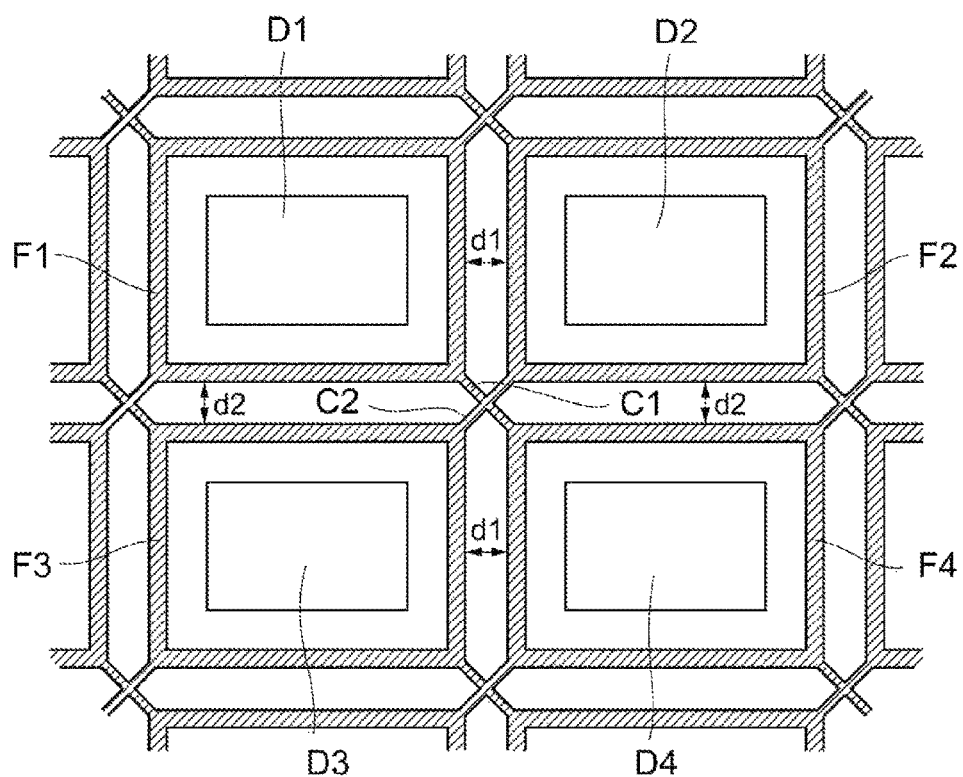
FIG. 2 is a partially enlarged view of a region B in FIG. 1.

FIG. 2 is a view illustrating an enlarged region B in FIG. 1. An example of a structure of sealing frames F and coupling portions C will be described with reference to FIG. 2. In the following description, coupling portions C1 and C2 are also collectively referred to as the "coupling portions C", sealing frames F1 to F4 are also collectively referred to as the "sealing frames F", and further, devices D1 to D4 are also collectively referred to as the "devices D".

The sealing frames F1 to F4 are provided to surround the devices D1 to D4, respectively, and seal each device. In the present embodiment, the sealing frames F1 to F4 have substantially rectangular shapes.

The sealing frames F1 and F3, and F2 and F4 are provided at a predetermined interval d1 apart from each other. Further, the sealing frames F1 and F2, and F3 and F4 are provided at a predetermined interval d2 apart from each other.

The intervals d1 and d2 are regions cut by a dicing blade or a laser in a dicing process. The intervals d1 and d2 are desirably larger than at least the width (dicing line) cut by the blade or the laser used for cutting with a dicing machine.

The coupling portion C1 is provided near an intersection of the intervals d1 and d2. The coupling portion C1 couples the sealing frames F1 and F4 which seal the devices D1 and D4, whose corners face each other, among a plurality of neighboring devices D1 to D4. The coupling portion C1 desirably couples the sealing frames F1 and F4 by coupling corner portions of the sealing frames F1 and F4. Accordingly, the length of the coupling portion C1 can be formed long. Consequently, it is possible to reduce a stress applied to the sealing frames F1 and F4 when the coupling portion C1 is cut by the dicing process.

The coupling portion C2 is provided near the intersection of the intervals d1 and d2. The coupling portion C2 couples the sealing frames F2 and F3 which seal the devices D2 and D3, whose corners face each other, among a plurality of neighboring devices D1 to D4. The coupling portion C2 desirably couples the sealing frames F2 and F3 by coupling corner portions of the sealing frames F2 and F3. Accordingly, the length of the coupling portion C2 can be formed long. Consequently, it is possible to reduce a stress applied to the sealing frames F2 and F3 when the coupling portion C2 is cut by the dicing process.

Further, the coupling portions C1 and C2 intersect each other near an intersection of the intervals d1 and d2. The coupling portions C1 and C2 are integrally formed at an intersecting point.

In this way, the coupling portions C couple the sealing frames F with each other, so that it is possible to prevent a chemical solution from entering a space between the upper substrate 13 and the lower substrate 14. More specifically, in a wet process, for example, it is possible to prevent the chemical solution from entering the gap between the upper substrate 13 and the lower substrate 14 via a gap of the sealing frames F and remaining therein. Consequently, it is possible to prevent the remaining chemical solution from leaking in other processes, or vaporizing and thereby contaminating equipment. Further, in a thermal processing process, it is possible to prevent damage of the wafer caused by vaporizing and expanding of the remaining chemical solution.

In addition, the coupling portions C according to the present embodiment couple the corner portions of the sealing frame F, so that it is possible to increase the lengths of the coupling portions C. Consequently, it is possible to reduce the stress applied to the sealing frames F when the coupling portions C are cut by the dicing process. Further, the width of the coupling portion C is desirably narrower than the width of the sealing frame F. As such, it is possible to further reduce the dicing stress applied to the sealing frames F, and further reduce waste materials, so that it is possible to enhance environmental resistance.

Further, for example, there is a case where the sealing frames F, and the upper substrate 13 and the lower substrate 14 are bonded by metal bonding. In this case, due to a difference in linear expansion caused by heating processing, a strong thermal stress remains at the corner portions of the sealing frames F. The coupling portions C are coupled to the corner portions of the sealing frames F, so that the remaining stress applied to the corner portions of the sealing frames F is dispersed to the portions coupled with the coupling portions C. Therefore, it is possible to prevent breakage of the sealing frames due to the thermal stress.

(3. Stacked Structure)

Figure 3:
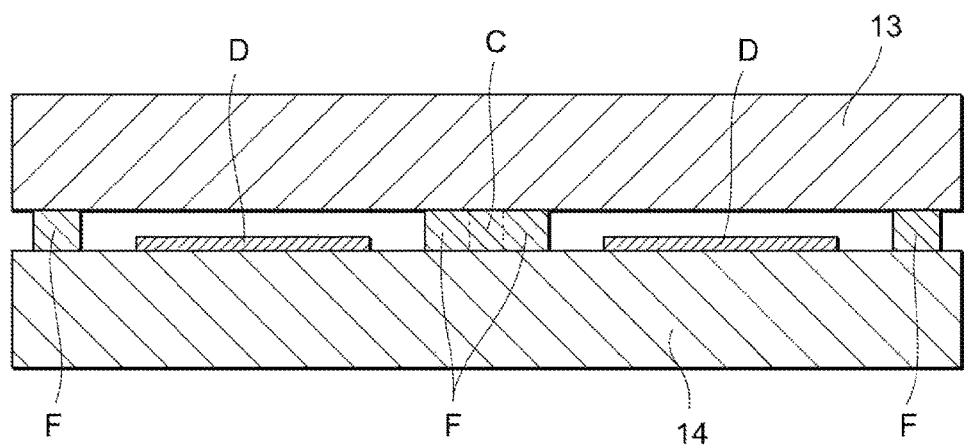
FIG. 3 is a cross-sectional view taken along line A-A' of FIG. 1.

FIG. 3 is a view illustrating a portion of an AA' cross-sectional view of FIG. 1. An AA' cross section is a cross section of the wafer level package 1 cut along a diagonal line of the device D. As shown in FIG. 3, in the wafer level package 1 according to the present embodiment, the sealing frames F and the coupling portions C are bonded on the lower substrate 14, and the upper substrate 13 covers and is bonded on the sealing frames F and the coupling portions C.

The upper substrate 13 and the lower substrate 14 are formed by silicon wafers or glasses having predetermined thicknesses.

The sealing frame F is formed by using, for example, an Au (gold) film, a Sn (tin) film, an Al (aluminum) film, an AlCu (aluminum copper) film, a Ge (germanium) film, or resin. The sealing frames F are formed on the upper substrate 13 and the lower substrate 14 to bond the upper substrate 13 and the lower substrate 14. Further, the coupling portions C are integrally formed by the same process as the sealing frames F.

The sealing frames F and the coupling portions C, and the upper substrate 13 and the lower substrate 14 are bonded by metal bonding, eutectic bonding, or direct bonding.

The lower substrate 14, the upper substrate 13, and the sealing frames F airtightly seal the devices D. This space may be filled with a gas such as an inert gas or may be placed in a vacuum state.

(4. Process Flow)

Figure 4:
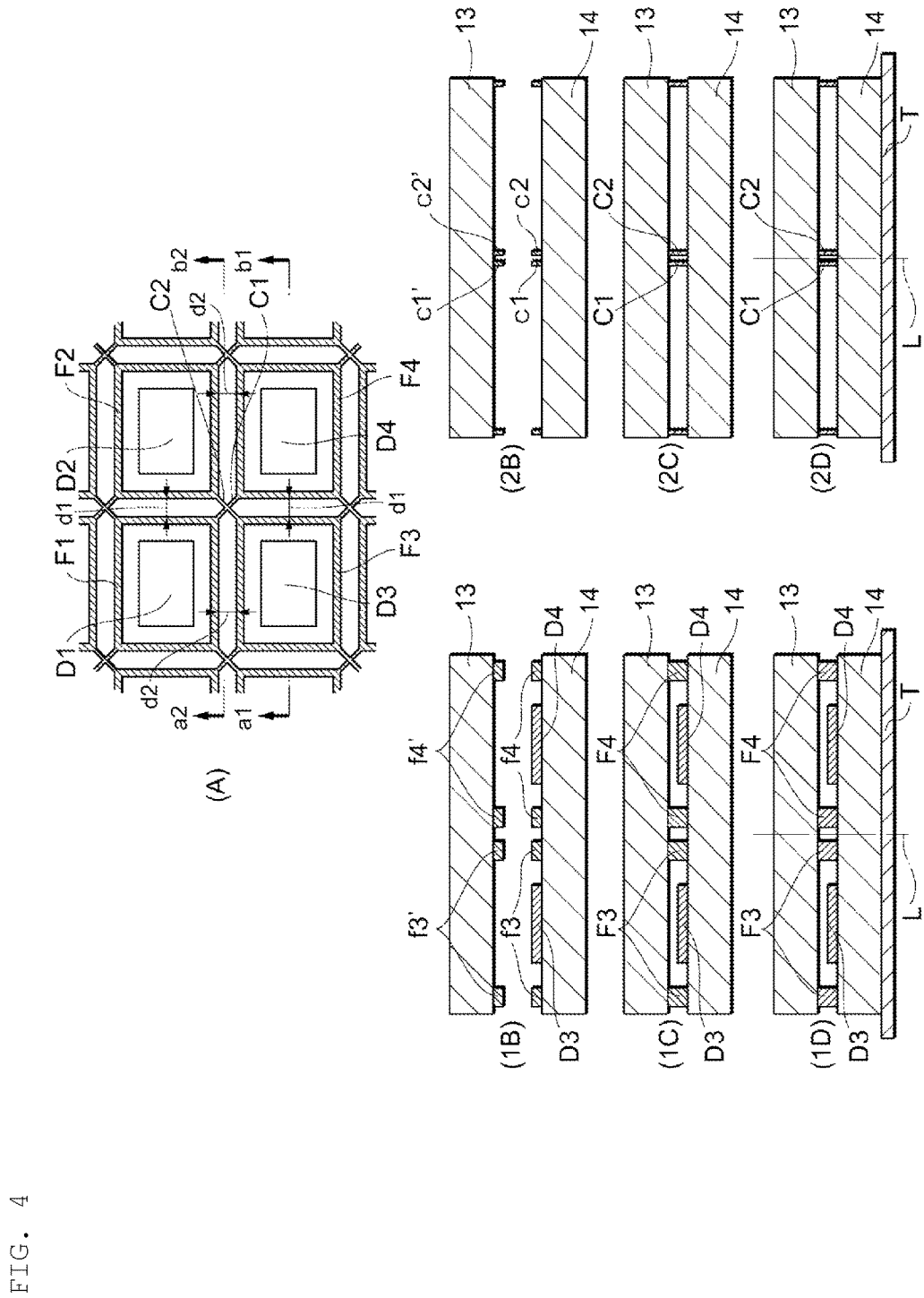
FIG. 4 is a process flow of manufacturing the wafer level package according to the first embodiment of the present invention.

FIG. 4 is a view illustrating an example of a process flow of manufacturing the wafer level package 1 according to the present embodiment.

Part (A) in FIG. 4 is a perspective plan view corresponding to the region B in FIG. 1. Parts (1B) to (1D) in FIG. 4 are the process flows seen from an a1-b1 cross section in Part (A) of FIG. 4.

First, as shown in Part (1B) of FIG. 4, bonding materials f3' and f4' are formed on the upper substrate 13. Further, bonding materials f3 and f4 are formed on the lower substrate 14.

In the next process, the bonding materials f3-f3' are bonded to form the sealing frames F3. Further, the bonding materials f4-f4' are bonded to form the sealing frames F4 (see Part (1C) of FIG. 4). The bonding materials f3-f3' and the bonding materials f4-f4' are bonded by using, for example, eutectic bonding or direct bonding. The bonding materials f3-f3' and the bonding materials f4-f4' are bonded to form the wafer level package 1.

Next, in the dicing process, the wafer level package 1 is cut with the dicing machine to manufacture a wafer level chip size package. In the dicing process, the lower substrate 14 is placed on a dicing tape T. The upper substrate 13 and the lower substrate 14 are cut with the dicing machine along a dicing line L by the blade or the laser (see Part (1D) of FIG. 4).

On the other hand, a process flow seen from a cross section including the coupling portions C will be described. Parts (2B) to (2D) in FIG. 4 are the process flows seen from an a2-b2 cross section in Part (A) of FIG. 4.

First, as shown in Part (2B) of FIG. 4, bonding materials c1' and c2' are formed on the upper substrate 13. Further, bonding materials c1 and c2 are formed on the lower substrate 14.

In the next process, the bonding materials c1-c1' are bonded to form the coupling portions C1. Further, the bonding materials c2-c2' are bonded to form the coupling portions C2 (See Part (2C) of FIG. 4). The bonding material c1-c1' and the bonding material c2-c2' are bonded by using, for example, eutectic bonding or direct bonding. The bonding materials c1-c1' and the bonding materials c2-c2' are bonded to form the wafer level package 1.

Next, in the dicing process of manufacturing the wafer level chip size package, the lower substrate 14 is placed on the dicing tape T. The upper substrate 13 and the lower substrate 14 are cut with the dicing machine along the dicing line L provided so as to cut the coupling portions C1 and C2 by the blade or the laser (See Part (2D) of FIG. 4).

As described above, in the wafer level package 1 according to the present embodiment, the coupling portions C couple the corners of the sealing frames F which respectively seal the devices D, whose corners face each other. Consequently, it is possible to increase the lengths of the coupling portions C, and reduce the stress applied to the sealing frames F by cutting with the dicing machine.

[Second Embodiment]

In a second embodiment and subsequent embodiments, matters common to those of the first embodiment will not be described, and only differences will be described. Particularly, the same operation and effect provided by the same configurations will not be mentioned sequentially in each embodiment.

Figure 5:
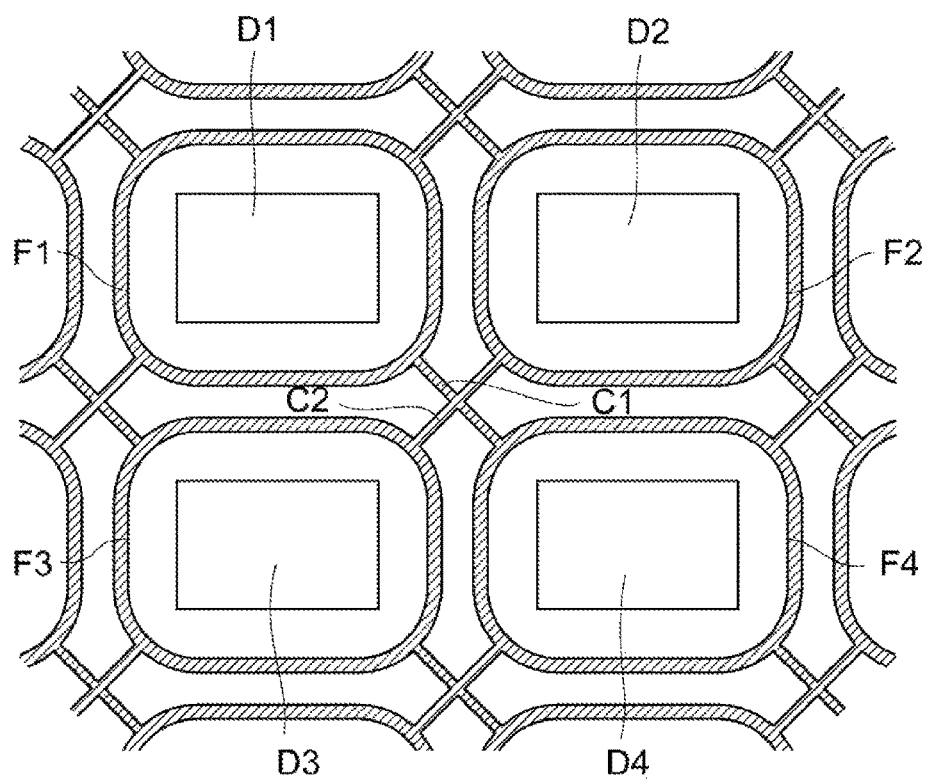
FIG. 5 corresponds to FIG. 2 and is a view illustrating a structure of sealing frames and coupling portions of a wafer level package according to a second embodiment of the present invention.

FIG. 5 is a view illustrating an example of a structure of sealing frames F and coupling portions C of a wafer level package 1 according to the present embodiment. Hereinafter, among the detailed configurations of the wafer level package 1 according to the present embodiment, differences from the first embodiment will be mainly described.

As illustrated in FIG. 5, in the present embodiment, the sealing frame F has a substantially rectangular shape having corner portions of R shapes (an example of arc shapes). A coupling portion C1 couples corner portions of sealing frames F1 and F4 at a point where corner portions are closest to each other. Similarly, a coupling portion C2 couples the corner portions of sealing frames F2 and F3 at a point where the corner portions are closest to each other.

As described above, the sealing frames F according to the present embodiment have the corner portions of the R shapes. Consequently, it is possible to adjust the lengths of the coupling portions C regardless of the width of the dicing line and the widths of the intervals d1 and d2. Consequently, it is possible to simultaneously reduce a stress applied to the sealing frames F by cutting with the dicing machine, and form more devices D on the lower substrate 14.

Other configurations and effects are the same as those of the first embodiment.

The above-described embodiments facilitate understanding of the present invention and are not intended to limit the present invention. The present invention can be modified/improved without departing from the gist of the invention, and include equivalents thereof. That is, design changes appropriately added to each embodiment by those skilled in the art are also incorporated in the scope of the present invention as long as the design changes include the features of the present invention. For example, the constituents of each embodiment, the arrangement, materials, conditions, shapes, and sizes of the constituents are not limited to those exemplified above and can be appropriately changed. For example, in the above-described embodiment, the sealing frames F having substantially rectangular shapes have been described. However, the sealing frames F are not limited thereto, and may have polygonal shapes, circular shapes, or elliptical shapes.

Naturally, each embodiment is an exemplary embodiment, and configurations described in the different embodiments can be partially replaced or combined and are also included in the scope of the present invention as long as the configurations include the features of the present invention.

DESCRIPTION OF REFERENCE SYMBOLS

1: wafer level package
13: upper substrate
14: lower substrate
D: device
C: coupling portion
F: sealing frame

The invention claimed is:
1. A wafer level package comprising:
a first wafer;
a second wafer facing the first wafer;
a plurality of chips between the first wafer and the second wafer and arranged in an array;
a plurality of sealing frames arranged at intervals and surrounding each of the plurality of chips to seal the plurality of chips between the first wafer and the second wafer; and
a coupling portion which couples opposed corners of respective sealing frames of the plurality of sealing frames,
wherein the opposed corners of the respective sealing frames have arc shapes.
2. The wafer level package according to claim 1, wherein corner portions of each of the plurality of sealing frames have arc shapes.

3. The wafer level package according to claim 1, wherein a width of the coupling portion is narrower than a width of the sealing frames.

4. The wafer level package according to claim 1, wherein a material of the plurality of sealing frames is selected from an Au film, a Sn film, an Al film, an AlCu film, a Ge film, or resin.

5. The wafer level package according to claim 1, wherein the predetermined intervals are larger than at least a width of a blade or laser used for cutting the wafer level package in a dicing process.

6. A wafer level chip size package which is formed by cutting the coupling portion of the wafer level package according to claim 1 by a dicing process.

7. A method of manufacturing a wafer level package, the method comprising:
forming a first bonding material pattern on a first surface of a first wafer, the first bonding material pattern surrounding each of a plurality of chips on the first surface and which are arranged in an array, and including first coupling portions coupling opposed corners of the first bonding material pattern;
forming a second bonding material pattern on a second surface of a second wafer facing the first wafer, and including second coupling portions coupling opposed corners of the second bonding material pattern; and
coupling the first bonding material pattern to the second bonding material pattern to form a plurality of sealing frames arranged at intervals and surrounding each of the plurality of chips to seal the plurality of chips between the first wafer and the second wafer, and a coupling portion which couples opposed corners of respective sealing frames of the plurality of sealing frames,
wherein the opposed corners of the respective sealing frames have arc shapes.

8. The method of manufacturing a wafer level package according to claim 7, wherein corner portions of each of the plurality of sealing frames have arc shapes.

9. The method of manufacturing a wafer level package according to claim 7, wherein a width of the coupling portion is narrower than a width of the sealing frames.

10. The method of manufacturing a wafer level package according to claim 7, wherein a material of the plurality of sealing frames is selected from an Au film, a Sn film, an Al film, an AlCu film, a Ge film, or resin.

11. The method of manufacturing a wafer level package according to claim 7, wherein the predetermined intervals are larger than at least a width of a blade or laser used for cutting the wafer level package in a dicing process.

12. The method of manufacturing a wafer level package according to claim 7, further comprising cutting the coupling portion of the wafer level package by a dicing process.

* * * * *